(12) United States Patent
Takeuchi

(10) Patent No.: US 10,752,391 B2
(45) Date of Patent: Aug. 25, 2020

(54) METHOD OF FEEDING ELECTRONIC COMPONENTS AND ELECTRONIC COMPONENT FEEDER

(71) Applicant: Murata Manufacturing Co., Ltd., Nagaokakyo-shi, Kyoto-fu (JP)

(72) Inventor: Satoru Takeuchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/715,936

(22) Filed: Dec. 16, 2019

(65) Prior Publication Data

US 2020/0115080 A1 Apr. 16, 2020

Related U.S. Application Data

(63) Continuation of application No. 16/420,215, filed on May 23, 2019, which is a continuation of application No. PCT/JP2017/043587, filed on Dec. 5, 2017.

(30) Foreign Application Priority Data

Dec. 7, 2016 (JP) ................. 2016-237477

(51) Int. Cl.
B65B 35/14 (2006.01)
B65B 5/12 (2006.01)
B65G 47/14 (2006.01)

(52) U.S. Cl.
CPC ............ *B65B 35/14* (2013.01); *B65B 5/12* (2013.01); *B65G 47/14* (2013.01)

(58) Field of Classification Search
CPC .................. B65B 35/14; B65B 5/12
(Continued)

(56) References Cited

U.S. PATENT DOCUMENTS

| | | | | |
|---|---|---|---|---|
| 4,395,184 A | * | 7/1983 | Braden | B05D 1/00 |
| | | | | 29/759 |
| 4,921,090 A | * | 5/1990 | Gregor | B65G 27/32 |
| | | | | 198/761 |

(Continued)

OTHER PUBLICATIONS

Takeuchi, "Method of Feeding Electronic Components and Electronic Component Feeder", U.S. Appl. No. 16/420,215, filed May 23, 2019.

*Primary Examiner* — Douglas A Hess
(74) *Attorney, Agent, or Firm* — Keating & Bennett, LLP

(57) ABSTRACT

A method and an apparatus for feeding electronic components are capable of increasing a rate of filling accommodation holes with electronic components. An accommodation plate including accommodation holes, respective openings of which are distributed over a main surface of the accommodation plate, is prepared, and electronic components are loaded onto the main surface of the accommodation plate. A horizontal vibration in an X-axis direction and/or a Y-axis direction and a vertical vibration in a Z-axis direction are applied to the accommodation plate with the main surface of the accommodation plate level. The horizontal and vertical vibrations have an equal number of vibrations and a prescribed phase difference therebetween. The accommodation plate is vibrated so that each of the electronic components is fed into one of the accommodation holes while moving over the main surface of the accommodation plate.

14 Claims, 10 Drawing Sheets

(58) Field of Classification Search
USPC .................. 198/394, 533, 752.1, 766, 617
See application file for complete search history.

(56) References Cited

U.S. PATENT DOCUMENTS

| | | | | |
|---|---|---|---|---|
| 4,960,195 | A * | 10/1990 | Yamaguchi | B65G 47/24 |
| | | | | 193/44 |
| 5,201,891 | A * | 4/1993 | Tsuchiya | B25B 11/00 |
| | | | | 198/383 |
| 5,205,395 | A * | 4/1993 | Bruno | B65G 27/24 |
| | | | | 198/389 |
| 5,818,061 | A * | 10/1998 | Stern | G01B 11/022 |
| | | | | 250/559.29 |
| 5,984,079 | A * | 11/1999 | Garcia | G01R 31/013 |
| | | | | 198/392 |
| 6,854,585 | B2 * | 2/2005 | Brooks | B65G 47/24 |
| | | | | 198/394 |
| 8,955,666 | B2 * | 2/2015 | Nakajima | B65G 47/1414 |
| | | | | 198/399 |
| 9,315,330 | B2 * | 4/2016 | Kimura | B65G 27/32 |
| 9,422,117 | B2 * | 8/2016 | Sano | B65G 47/14 |
| 9,669,432 | B2 * | 6/2017 | McCarthy | B07C 5/3422 |

* cited by examiner

METHOD OF FEEDING ELECTRONIC COMPONENTS AND ELECTRONIC COMPONENT FEEDER

CROSS REFERENCE TO RELATED APPLICATIONS

This application claims the benefit of priority to Japanese Patent Application No. 2016-237477 filed on Dec. 7, 2016 and is a Continuation Application of PCT Application No. PCT/JP2017/043587 filed on Dec. 5, 2017. The entire contents of each of these applications are hereby incorporated herein by reference.

BACKGROUND OF THE INVENTION

1. Field of the Invention

The present invention relates to a method of feeding electronic components into accommodation holes provided in an accommodation plate and a feeder that performs this method in order to facilitate handling of electronic components as workpieces. Herein, an "electronic component" refers to not only an electronic component as a finished product, but also a component that is an intermediate product during manufacture of an electronic component and is to be a component for an electronic component as a finished product, such as a chip-shaped electronic component body before it is provided with an external electrode.

2. Description of the Related Art

A method of feeding electronic components, which is of interest to preferred embodiments of the present invention, is described in Japanese Patent Laid-Open No. 2004-359512, for example. Japanese Patent Laid-Open No. 2004-359512 describes a method of preparing an accommodation plate with a plurality of accommodation holes, loading a plurality of electronic components onto the accommodation plate, and oscillating the accommodation plate about a prescribed axis and simultaneously vibrating the accommodation plate in the direction of the axis, thus feeding each of the plurality of electronic components into a corresponding one of the plurality of accommodation holes while moving the electronic components on the accommodation plate.

In the method described in Japanese Patent Laid-Open No. 2004-359512, the movement of the electronic component on the accommodation plate is mainly triggered by oscillation of the accommodation plate. The plurality of electronic components thus repeatedly move in one direction and the other direction on the accommodation plate while rolling by gravity as a single mass and also being agitated. Then, those of the moving electronic components, each of which is aligned with a corresponding one of the accommodation holes, are fed into the accommodation holes.

In the feeding method based on the above principle, an impact of rolling or falling by gravity on the electronic component is relatively large. Consequently, the electronic component may easily become cracked or chipped. In particular, cracking or chipping is serious in a ceramic electronic component including a component body made of ceramic.

Also, there is a limit on increasing a rate of filling accommodation holes with electronic components, that is, a ratio of the number of accommodation holes into which electronic components are fed to the number of accommodation holes of the accommodation plate, with the use of the method described in Japanese Patent Laid-Open No. 2004-359512.

It is conceivable that the accommodation plate will be oscillated more frequently in order to increase the rate of filling accommodation holes with electronic components. However, the electronic components are subjected to impact more frequently as the accommodation plate is oscillated more frequently. This undesirably increases the number of electronic components that are cracked or chipped.

It is also conceivable that much more electronic components than accommodation holes will be loaded onto the accommodation plate in order to increase the rate of filling accommodation holes with electronic components. However, each electronic component rolling in accordance with the oscillation of the accommodation plate is subjected to greater impact as the number of electronic components loaded onto the accommodation plate increases. This may undesirably increase the number of electronic components which are cracked or chipped.

SUMMARY OF THE INVENTION

Preferred embodiments of the present invention provide methods of feeding electronic components and electronic component feeders, which are each resistant to cracking or chipping of electronic components being handled and are each capable of easily increasing a rate of filling accommodation holes with electronic components.

A preferred embodiment of the present invention is directed to a method of feeding electronic components which is performed using an accommodation plate including a plurality of accommodation holes, respective openings of which are distributed over a main surface of the accommodation plate.

A method of feeding electronic components according to a preferred embodiment of the present invention includes preparing the accommodation plate, and loading a plurality of electronic components onto a main surface of the accommodation plate. The method according to this preferred embodiment of the present invention further includes applying a horizontal vibration in at least one of an X-axis direction and a Y-axis direction and a vertical vibration in a Z-axis direction to the accommodation plate while keeping the main surface of the accommodation plate level, where the X-axis direction and the Y-axis direction are orthogonal or substantially orthogonal to each other on a horizontal plane and the Z-axis direction is orthogonal or substantially orthogonal to both of the X-axis direction and the Y-axis direction. The applying of the vibrations to the accommodation plate includes moving the plurality of electronic components over the main surface of the accommodation plate, and feeding each of the plurality of electronic components into a corresponding one of the plurality of accommodation holes while moving the plurality of electronic components over the main surface of the accommodation plate.

In a method according to a preferred embodiment of the present invention, the accommodation plate is not oscillated, but a horizontal vibration and a vertical vibration are applied to the accommodation plate while keeping the main surface of the accommodation plate level, thus moving the plurality of electronic components over the main surface of the accommodation plate.

Preferably, in a preferred embodiment of the present invention, the horizontal vibration and the vertical vibration have an equal or substantially equal number of vibrations and have a prescribed phase difference therebetween. This configuration is able to reliably move the electronic components on the accommodation plate.

In a preferred embodiment of the present invention, the number of vibrations of the horizontal vibration and the vertical vibration is preferably about 50 Hz or more. Setting the number of vibrations to about 50 Hz or more is able to increase the speed at which the electronic components move on the accommodation plate.

In a preferred embodiment of the present invention, the applying of the vibrations to the accommodation plate may include adjusting the phase difference between the horizontal vibration and the vertical vibration. Adjusting the phase difference in this manner is able to change the speed at which the electronic components move on the accommodation plate.

In particular, in the adjusting of the phase difference, the direction in which the electronic components move on the accommodation plate is able to be reversed by reversing the phase difference to be plus or minus.

In a preferred embodiment of the present invention, the applying of the vibrations to the accommodation plate may include adjusting an amplitude of at least one of the horizontal vibration and the vertical vibration. Adjusting the amplitude in this manner is able to change the speed at which the electronic components move on the accommodation plate.

In the feeding of each of the plurality of electronic components into a corresponding one of the plurality of accommodation holes, it may be intended that one electronic component be fed into one accommodation hole or a plurality of electronic components be fed into one accommodation hole.

When one electronic component is to be fed into one accommodation hole as in the former case, each of the accommodation holes preferably has a depth dimension equal or substantially equal to a length dimension of any one side among outside dimensions of each of the electronic components. Such a configuration achieves a state in which one surface of the electronic component fed into the accommodation hole is aligned with the opening of the accommodation hole and is flush with the main surface of the accommodation plate, and this one surface supports the electronic component, which is about to pass through the accommodation hole, and make the movement path of the electronic component flatter. This allows a succeeding electronic component to be moved smoothly on the accommodation plate.

In particular, each of the electronic components has a rectangular or substantially rectangular parallelepiped shape defined by a length dimension, a width dimension, and a thickness dimension measured in a length direction, a width direction, and a thickness direction orthogonal or substantially orthogonal to each other, respectively. When the length dimension is largest among the length dimension, the width dimension, and the thickness dimension, the above operation and effect are achieved more reliably.

More preferably, in a preferred embodiment of the present invention, a depth dimension of each of the accommodation holes is equal or substantially equal to the length dimension, and an opening of each of the accommodation holes is selected so as not to accept the length dimension and so as to accept the width dimension and the thickness dimension. This configuration allows the electronic component to always be fed into the accommodation hole in an appropriate orientation. Also, with this configuration, a disadvantage that the electronic component fed into the accommodation hole falls out of the accommodation hole due to, for example, the vertical vibration of accommodation plate is less likely to occur.

Contrastingly, when the above condition is not satisfied, in the feeding of each of the plurality of electronic components into a corresponding one of the plurality of accommodation holes, an irregular state may be caused, in which some of the electronic components are fed into one of the accommodation holes even though one electronic component is to be fed into one accommodation hole, or the electronic components are fed into the accommodation holes in an orientation other than a regular orientation. In this case, further increasing an amplitude of at least the vertical vibration is preferably performed in the applying of the vibrations to the accommodation plate in order to resolve the irregular state.

In a method according to a preferred embodiment of the present invention, the applying of the vibrations to the accommodation plate may further include, after the feeding of each of the plurality of electronic components into a corresponding one of the plurality of accommodation holes, finding the accommodation holes yet to be filled, into which the electronic components have not been fed, and moving the electronic components which have not been fed into the accommodation holes and remain on the main surface of the accommodation plate toward the accommodation holes yet to be filled. This configuration increases the rate of filling accommodation holes with electronic components in a short period of time.

Preferably, in a method according to a preferred embodiment of the present invention, in the loading of the plurality of electronic components onto the main surface of the accommodation plate, a larger number of electronic components than the accommodation holes are loaded. This more easily achieves a rate of 100% of filling accommodation holes with electronic components.

In a preferred embodiment of the present invention, when a plurality of electronic components are to be fed into one accommodation hole as described above, the accommodation hole has a longitudinal opening which allows some of the electronic components to be fed thereinto in a column.

When the accommodation plate is removable from the feeder, a preferred embodiment of the present invention may further include removing the accommodation plate with some of the accommodation holes filled with the electronic components.

In the above case, a plurality of the accommodation plates may be prepared, and the feeding of each of the plurality of electronic components into a corresponding one of the plurality of accommodation holes may be performed with a plurality of the main surfaces of the plurality of accommodation plates being flush with each other, and in the removing of the accommodation plate, the plurality of accommodation plates may be removed at different points in time. With this configuration, the accommodation plates are able to be sequentially sent to a following step starting from any accommodation plate in which a plurality of accommodation holes have been filled with electronic components, leading to efficient progress of steps. Also, one vibration imparting mechanism is able to be shared by a plurality of accommodation plates.

A preferred embodiment of the present invention is also directed to an electronic component feeder which performs the method of feeding electronic components described above.

Since each of the preferred embodiments of the present invention moves a plurality of electronic components over the main surface of the accommodation plate by applying a horizontal vibration and a vertical vibration to the accommodation plate, the impact on the electronic components is able to be reduced when the accommodation plate is oscillated. The electronic components are thus resistant to cracking or chipping.

Since the horizontal vibration and the vertical vibration described above allow a plurality of electronic components on an accommodation plate to move over the main surface of the accommodation plate while being agitated very little or not at all, the plurality of electronic components are more easily fed into accommodation holes. Also, since an impact on the electronic component is smaller as described above, the following manner may be used without any problem in order to increase the rate of filling accommodation holes with electronic components: for example, the movement of electronic components is repeated, or a larger number of electronic components than accommodation holes are loaded onto the accommodation plate. The rate of filling accommodation holes with electronic components is thus able to be increased relatively easily.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
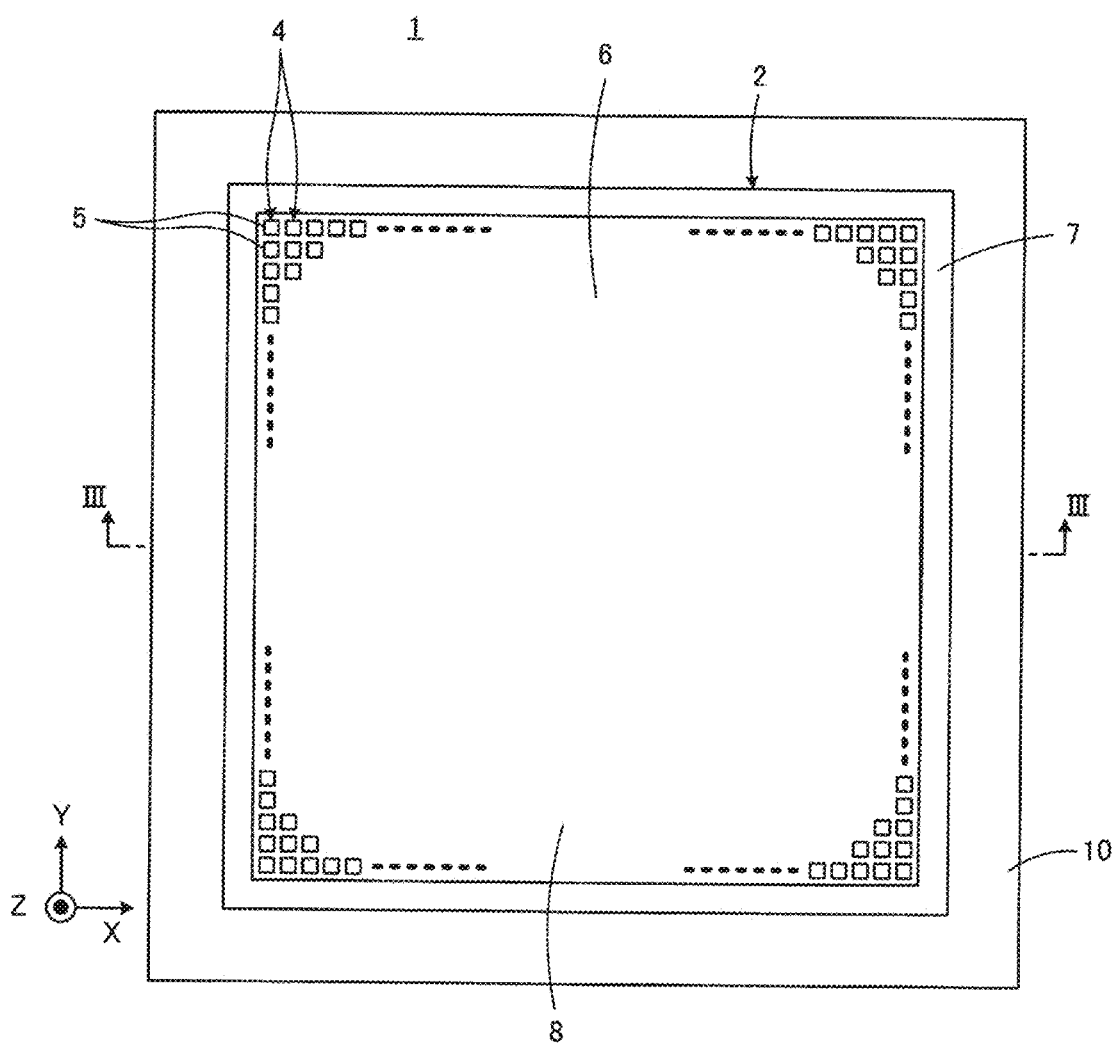
FIG. 1 is a plan view of a feeder 1 which performs a method of feeding electronic components according to a Preferred Embodiment 1 of the present invention.

Hereinbelow, the present invention will be described with reference to preferred embodiments while referring to the drawings. The same or corresponding portions have the same reference characters in the drawings, and overlapping description will not be repeated.

A configuration of a feeder 1 which performs a method of feeding electronic components according to a Preferred Embodiment 1 of the present invention will be described with reference to FIGS. 1 to 5.

Feeder 1 includes an accommodation plate 2. Accommodation plate 2 includes a plurality of accommodation holes 4, each of which accommodates a corresponding one of electronic components 3 (see FIG. 5). FIG. 1 does not show all of accommodation holes 4 but merely shows some of them. Respective openings 5 of accommodation holes 4 are distributed over a main surface 6 of accommodation plate 2 while being arranged in a row direction and a column direction. A frame member 7 is disposed on the periphery of main surface 6 of accommodation plate 2, which prevents electronic components 3 loaded onto main surface 6 of accommodation plate 2 from falling out of accommodation plate 2.

In the present preferred embodiment, electronic components 3 are fed into their corresponding accommodation holes 4 one by one. When electronic components 3 fed into accommodation holes 4 are electronic components as finished products, electronic components 3 are held on accommodation plate 2 while being aligned with each other, which is convenient to supply the electronic components to, for example, a characteristic measuring step or a packaging step. Also, when electronic components 3 fed into accommodation holes 4 are chip-shaped electronic component bodies before being provided with external electrodes, the electronic component bodies are held on accommodation plate 2 while being aligned with each other, which is convenient to supply the electronic component bodies to the step for forming external electrodes.

Accommodation plate 2 preferably includes an upper plate 8, in which accommodation hole 4 is defined as a through-hole, and a lower plate 9, which defines and functions as a bottom wall of accommodation hole 4. In this case, several types of upper plates having different thickness dimensions or different opening dimensions of accommodation holes 4 are prepared, so that a change in the dimension or shape of electronic component 3 to be handled is able to be accommodated promptly with lower plate 9 being shared among upper plates 8.

Feeder 1 includes a base 10 supporting accommodation plate 2 described above. Base 10 maintains main surface 6 of accommodation plate 2 level. In the following description, as shown in a margin of each of FIGS. 1 to 5, an X-axis direction and a Y-axis direction are orthogonal or substantially orthogonal to each other on a horizontal plane, and a Z-axis direction is orthogonal or substantially orthogonal to both of the X-axis direction and the Y-axis direction.

Base 10 and accommodation plate 2 are coupled to each other with a vibration imparting mechanism 11, which will be described below in detail, therebetween.

Figure 2:
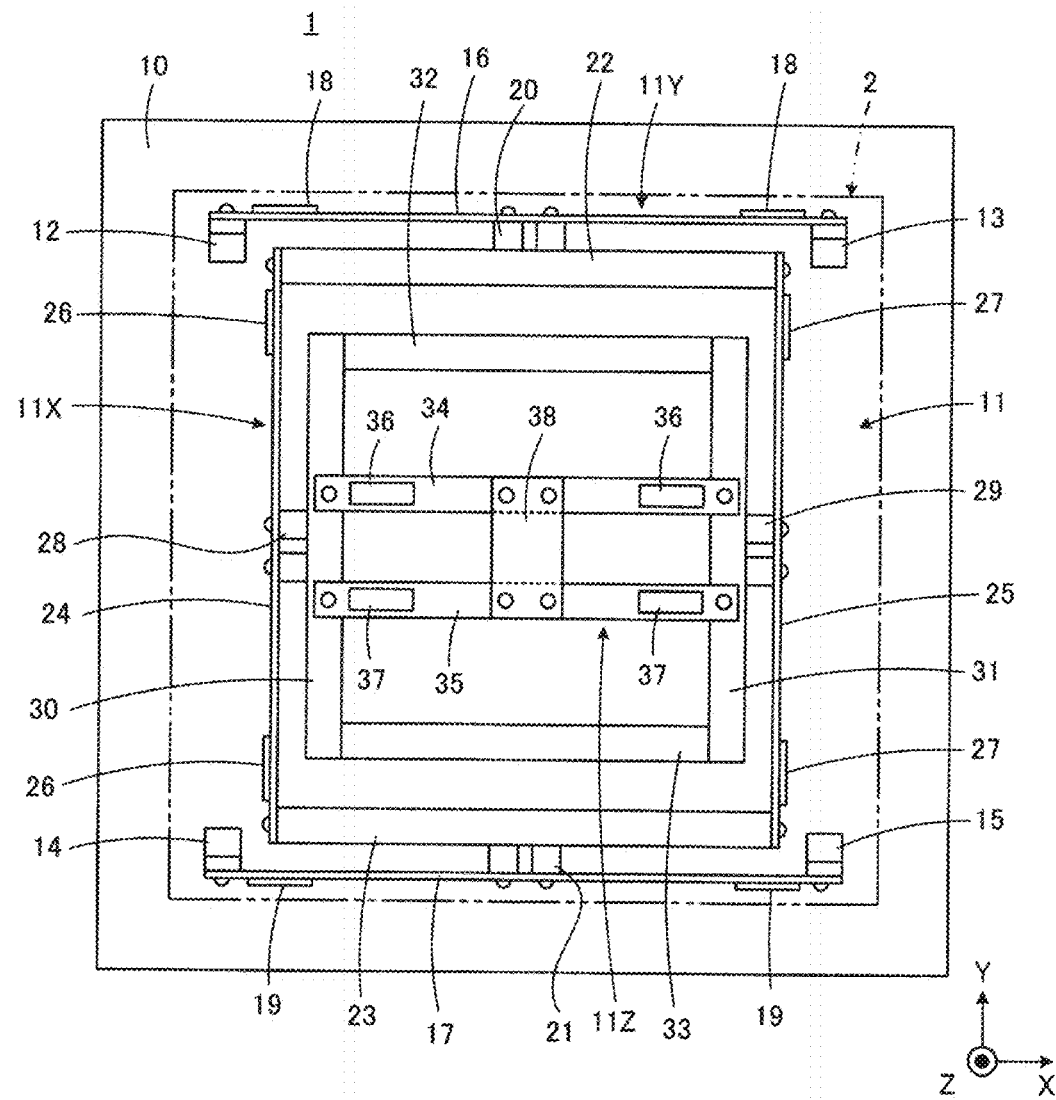
FIG. 2 is a plan view of a vibration imparting mechanism 11 incorporated in feeder 1 shown in FIG. 1.

Mainly referring to FIG. 2, first, vibration imparting mechanism 11 includes a Y-axis direction vibrating mechanism 11Y that provides vibrations in the Y-axis direction to accommodation plate 2 (in FIG. 2, indicated by an imaginary line). Y-axis direction vibrating mechanism 11Y includes four brackets 12 to 15 provided on base 10, a leaf spring 16 provided across brackets 12 and 13, a leaf spring 17 provided across brackets 14 and 15, piezoelectric devices 18 and 19 attached to the vicinities of the longitudinal ends of leaf springs 16 and 17, respectively, and Y-axis vibration transmission rods 22 and 23 coupled to the longitudinal central portions of leaf springs 16 and 17 with coupling spacers 20 and 21 therebetween, respectively.

In Y-axis direction vibrating mechanism 11Y, an AC voltage having a prescribed frequency is applied to piezoelectric devices 18 and 19 in order to provide vibrations in the Y-axis direction to accommodation plate 2. Consequently, leaf springs 16 and 17 deform while curving in the same direction in synchronization with each other with the number of vibrations corresponding to the frequency. Such curvature deformation is transmitted to Y-axis vibration transmission rods 22 and 23 through coupling spacers 20 and 21, respectively, thus vibrating Y-axis vibration transmission rods 22 and 23 in the Y-axis direction with the number of vibrations.

Vibration imparting mechanism 11 also includes an X-axis direction vibrating mechanism 11X that provides vibrations in the X-axis direction to accommodation plate 2. X-axis direction vibrating mechanism 11X includes leaf springs 24 and 25 each provided across the longitudinal ends of Y-axis vibration transmission rods 22 and 23, piezoelectric devices 26 and 27 attached to the vicinities of the longitudinal ends of leaf springs 24 and 25, respectively, and X-axis vibration transmission rods 30 and 31 coupled to the longitudinal central portions of leaf springs 24 and 25 with coupling spacers 28 and 29 therebetween, respectively. The longitudinal ends of X-axis vibration transmission rods 30 and 31 are coupled to each other by coupling rods 32 and 33.

In X-axis direction vibrating mechanism 11X, an AC voltage having a prescribed frequency is applied to piezoelectric devices 26 and 27 in order to provide vibrations in the X-axis direction to accommodation plate 2. Consequently, leaf springs 24 and 25 deform while curving in the same direction in synchronization with each other with the number of vibrations corresponding to the frequency. Such curvature deformation is transmitted to X-axis vibration transmission rods 30 and 31 through coupling spacers 28 and 29, thus vibrating X-axis vibration transmission rods 30 and 31 in the X-axis direction with the number of vibrations.

Vibration imparting mechanism 11 further includes a Z-axis direction vibrating mechanism 11Z that provides vibrations in the Z-axis direction to accommodation plate 2. Z-axis direction vibrating mechanism 11Z includes leaf springs 34 and 35 each provided across the longitudinal central portions of X-axis vibration transmission rods 30 and 31, piezoelectric devices 36 and 37 attached to the vicinities of the longitudinal ends of leaf springs 34 and 35, respectively, and a pedestal 38 provided between the longitudinal central portions of leaf springs 34 and 35. Accommodation plate 2 is attached on pedestal 38.

In Z-axis direction vibrating mechanism 11Z, an AC voltage having a prescribed frequency is applied to piezoelectric devices 36 and 37 in order to provide vibrations in the Z-axis direction to accommodation plate 2. Consequently, leaf springs 34 and 35 deform while curving in the same direction in synchronization with each other with the number of vibrations corresponding to the frequency. Such curvature deformation is transmitted to accommodation plate 2 through pedestal 38, thus vibrating accommodation plate 2 in the Z-axis direction with the number of vibrations.

Although description has been provided of the transmission of the vibrations in the Y-axis direction by Y-axis direction vibrating mechanism 11Y to Y-axis vibration transmission rods 22 and 23, the vibrations in the Y-axis direction of Y-axis vibration transmission rods 22 and 23 are transmitted to accommodation plate 2 through leaf springs 24 and 25, coupling spacers 28 and 29, X-axis vibration transmission rods 30 and 31, leaf springs 34 and 35, and pedestal 38 in order.

Also, though description has been provided of the transmission of the vibrations in the X-axis direction by X-axis direction vibrating mechanism 11X to X-axis vibration transmission rods 30 and 31, the vibrations in the X-axis direction of X-axis vibration transmission rods 30 and 31 are transmitted to accommodation plate 2 through leaf springs 34 and 35 and pedestal 38 in order.

As described above, the vibrations in the X-axis direction, the Y-axis direction, and the Z-axis direction are applied to accommodation plate 2 by X-axis direction vibrating mechanism 11X, Y-axis direction vibrating mechanism 11Y, and Z-axis direction vibrating mechanism 11Z, respectively. In feeding of electronic components 3 into accommodation holes 4 with feeder 1, for example, only any one of X-axis direction vibrating mechanism 11X and Y-axis direction vibrating mechanism 11Y is driven in order to provide a horizontal vibration, and Z-axis direction vibrating mechanism 11Z is driven in order to provide a vertical vibration. Although the operation of feeder 1 will be described below to clarify a feeding method according to a Preferred Embodiment 1 of the present invention, the following description assumes that only X-axis direction vibrating mechanism 11X is driven in order to provide a horizontal vibration.

Figure 3:
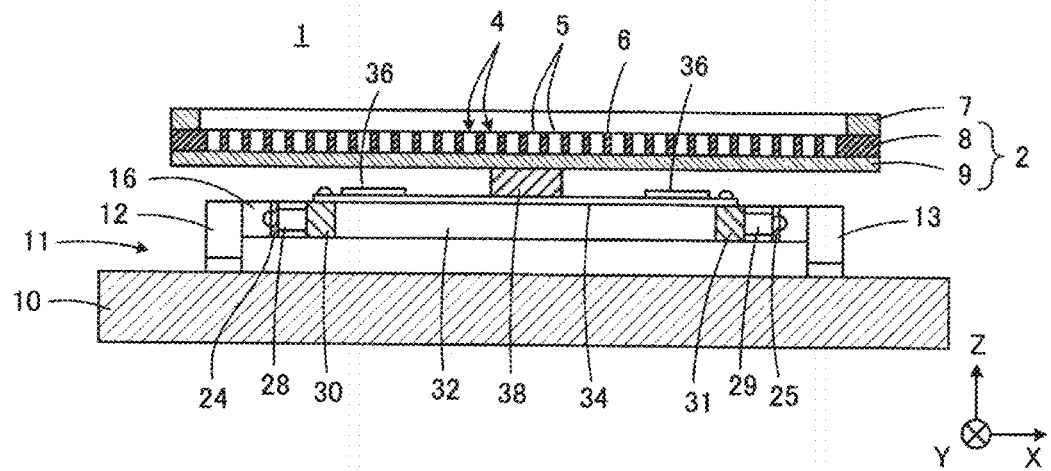
FIG. 3 is a sectional view of feeder 1 which is taken along the line in FIG. 1.
Figure 4:
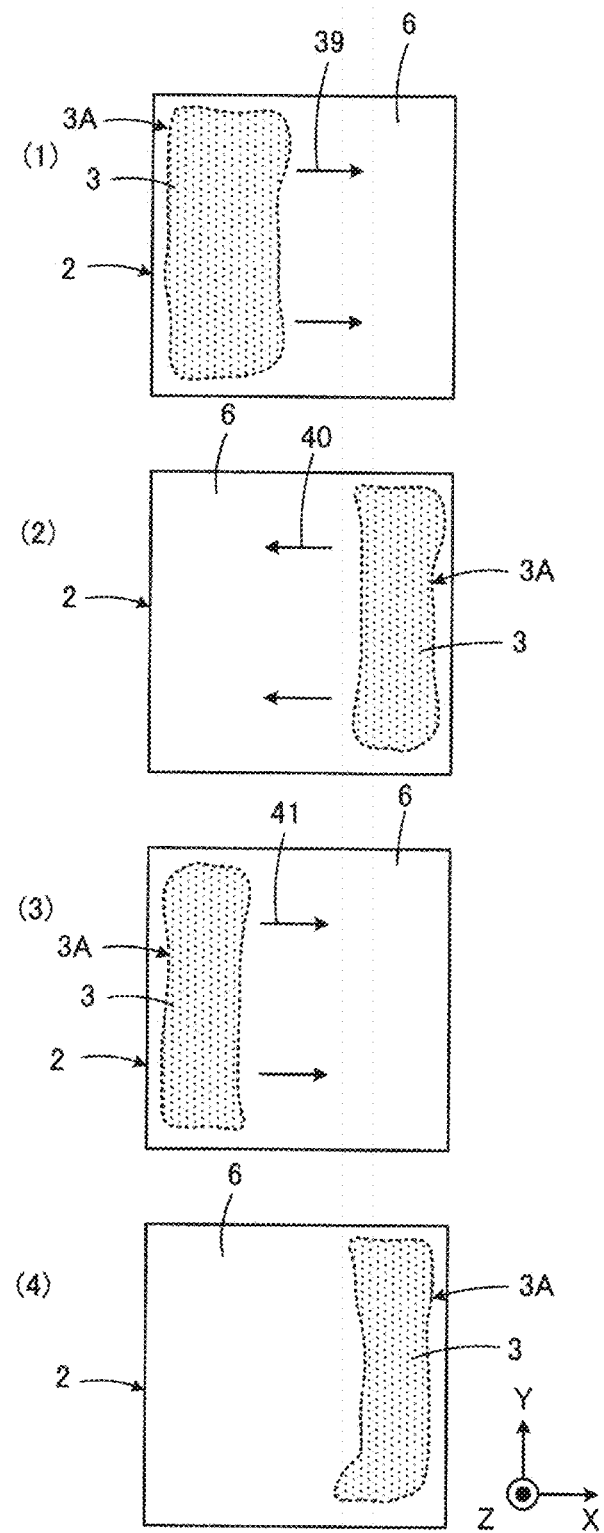
FIG. 4 is a plan view schematically showing an example operation of feeder 1 shown in FIG. 1.

In executing the feeding method, first, accommodation plate 2 is placed in feeder 1 as shown in FIGS. 1 to 3, and electronic components 3 are loaded onto main surface 6 of accommodation plate 2. This state is schematically shown in FIG. 4(1). As seen in part (1) of FIG. 4, electronic components 3 are loaded while being bunched up to, for example, the left portion of main surface 6 of accommodation plate 2.

Parts (1) to (4) of FIG. 4 show no accommodation holes 4. In parts (1) to (4) of FIG. 4, an aggregate of electronic components 3 is shown as an electronic component group 3A. In one example, when 2646 accommodation holes 4 are provided in 49 rows and 54 columns in accommodation plate 2, about 4000 electronic components 3, that is about 1.5 times as many as accommodation holes 4, are loaded onto main surface 6 of accommodation plate 2.

Electronic component 3 in the present preferred embodiment preferably has, for example, a chip shape, which has a planar dimension of about 0.25 mm×about 0.125 mm and a thickness dimension of about 0.125 mm or less at minimum and has a planar dimension of about 5.7 mm×about 5.0 mm and a thickness dimension of about 5.0 mm or less at maximum.

Figure 5:
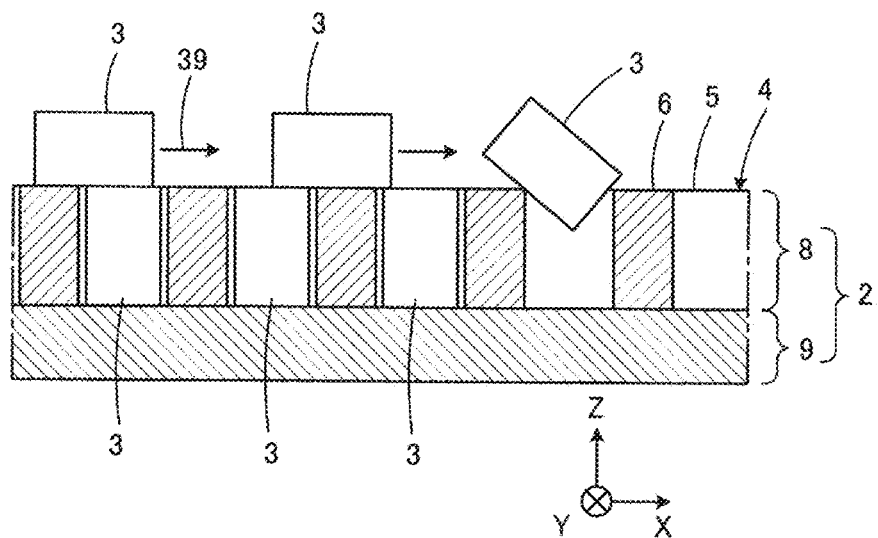
FIG. 5 is a sectional view schematically showing electronic components 3, which are fed into, and an electronic component 3, which is to be fed into, accommodation holes 4 of an accommodation plate 2 in feeder 1 shown in FIG. 1.

Subsequently, X-axis direction vibrating mechanism 11X and Z-axis direction vibrating mechanism 11Z are driven with main surface 6 of accommodation plate 2 maintained level. That is to say, the horizontal vibration in the X-axis direction and the vertical vibration in the Z-axis direction are applied to accommodation plate 2. This causes electronic components 3 to move in the direction of arrows 39 which is the X-axis direction as shown in part (1) of FIG. 4 along main surface 6 of accommodation plate 2 while showing electronic component group 3A as a single mass. Then, during this movement, electronic components 3 are fed into their corresponding accommodation holes 4 one by one as shown in FIG. 5.

Preferably, the horizontal vibration and the vertical vibration described above have an equal or substantially equal number of vibrations and have a prescribed phase difference therebetween. Consequently, the horizontal vibration and the vertical vibration are combined into a vibration that provides an elliptical orbit, and the direction of the major axis of the ellipse is directed to obliquely intersect with main surface 6 of accommodation plate 2. The vibration having the elliptical orbit in such an oblique direction defines and functions as a drive source, and when electronic component 3 moves in the direction indicated by arrows 39 in part (1) of FIG. 4 and FIG. 5 and is aligned with an empty accommodation hole 4, electronic component 3 is fed into this accommodation hole 4 as shown in the right portion of FIG. 5.

The number of vibrations of the horizontal vibration and the vertical vibration is preferably, for example, about 50 Hz or more. Setting the number of vibrations to about 50 Hz or more increases the speed at which electronic components 3 move on accommodation plate 2. The amplitude of each of the horizontal vibration and the vertical vibration is selected so as to prevent a drawback that, for example, electronic component 3 which has been fed into accommodation hole 4 fall out of accommodation hole 4. For example, the amplitude is set to about 0.05 mm or more and about 0.5 mm or less, and preferably, about 0.05 mm or more and about 0.15 mm or less.

In the present preferred embodiment, one electronic component 3 is to be fed into one accommodation hole 4. In this case, as shown from FIG. 5, the depth dimension of accommodation hole 4 is preferably equal or substantially equal to the length dimension of the longest side among the outside dimensions of electronic component 3. With such a configuration, one surface of electronic component 3 fed into accommodation hole 4 is aligned with opening 5 of accommodation hole 4 and supports electronic component 3, which is about to pass through accommodation hole 4 next, and make a movement path thereof flatter. Thus, a succeeding electronic component 3 is able to be moved smoothly on accommodation plate 2.

The above advantageous operations and effects are achieved more remarkably when electronic component 3 has a rectangular or substantially rectangular parallelepiped shape defined by a length dimension, a width dimension, and a thickness dimension measured in the length direction, the width direction, and the thickness direction orthogonal or substantially orthogonal to each other, respectively, and when the length dimension is largest among the length dimension, the width dimension, and the thickness dimension.

In the present preferred embodiment, a dimension of the opening of accommodation hole 4 is preferably selected so as not to accept the length dimension and so as to accept the width dimension and the thickness dimension. This allows electronic component 3 to be always fed into accommodation hole 4 in an appropriate orientation. Also, a disadvantage that electronic component 3 fed into accommodation hole 4 falls out of accommodation hole 4 due to, for example, the vertical vibration of accommodation plate 2 is less likely to occur.

As a result of the movement of electronic component group 3A in the direction of arrows 39 as shown in part (1) of FIG. 4, as shown in part (2) of FIG. 4, electronic component group 3A is bunched up to the right portion of main surface 6 of accommodation plate 2. Since electronic components 3 are fed into accommodation holes 4 during this movement, electronic components 3 that reach the right portion of main surface 6 of accommodation plate 2 are fewer than electronic components 3 originally loaded. Also, normally at this stage, all of accommodation holes 4 are not filled with electronic components 3, and several accommodation holes 4 are left empty.

Subsequently, in order to feed electronic components 3 into accommodation holes 4 that have been left empty, as indicated by arrows 40 in the X-axis direction in part (2) of FIG. 4, electronic component group 3A is moved in the opposite direction on accommodation plate 2. This opposite movement is achieved by reversing the phase difference between the horizontal vibration and the vertical vibration provided to accommodation plate 2 to be plus or minus. During this movement of electronic component group 3A in the direction of arrows 40, electronic components 3 are fed into accommodation holes 4 yet to be filled.

A period of time to perform the step of moving in the direction of arrows 40 is normally made shorter than a period of time for performing the step of moving in the direction of arrows 39 described above. In other words, the speed of movement in the direction of arrows 40 is higher than the speed of movement in the direction of arrows 39. At the stage at which the step of moving in the direction of arrows 40 is about to be performed, remaining electronic components 3 which have not been fed into accommodation holes 4 are fewer than electronic components 3 originally loaded. Such a change in the speed of movement is achieved by changing a phase difference between the horizontal vibration and the vertical vibration or changing the amplitudes of the horizontal vibration and the vertical vibration to further increase a vibration component in the horizontal direction, that is, the X-axis direction.

As a result of the movement of electronic component group 3A in the direction of arrows 40 shown in part (2) of FIG. 4, as shown in part (3) of FIG. 4, electronic component group 3A is bunched up to the left portion of main surface 6 of accommodation plate 2. Also at this stage, some accommodation holes 4 may still be left empty, and when all of accommodation holes 4 need to be filled with electronic components 3, electronic component group 3A is moved in the direction indicated by arrows 41 shown in part (3) of FIG. 4, and as shown in part (4) of FIG. 4, electronic component group 3A is bunched up to the right portion of main surface 6 of accommodation plate 2 again. Further, switching of the direction in which electronic component group 3A moves may be repeated as necessary.

As shown in FIG. 5 described above, the depth dimension of accommodation hole 4 is preferably equal or substantially equal to the length dimension which is largest among the outside dimensions of electronic component 3 in order to cause a surface of electronic component 3 fed into accommodation hole 4 to be aligned with opening 5 of accommodation hole 4 and support electronic component 3, which is about to pass through the relevant accommodation hole 4, and make the movement path thereof flatter. In actuality, however, loss of the above function is able to be prevented if the length dimension of electronic component 3 is slightly larger than the depth dimension of accommodation hole 4.

Figure 6:
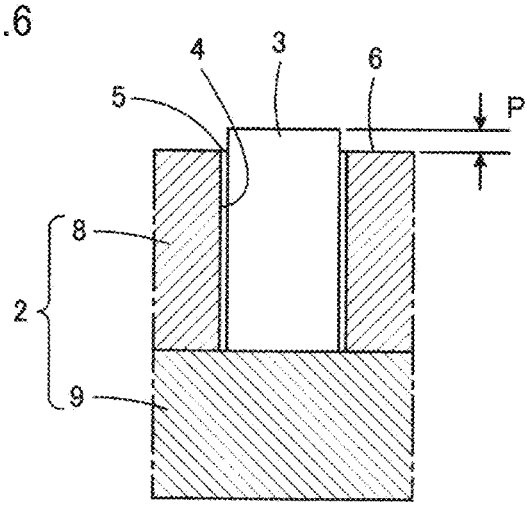
FIG. 6 is a sectional view for illustrating an allowable range of a dimension of projection P of electronic component 3 fed into accommodation hole 4 from a main surface 6 of accommodation plate 2.

Referring to FIG. 6, the above function is not impaired if a dimension of projection P of electronic component 3 fed into accommodation hole 4 from main surface 6 of accommodation plate 2 is preferably about 0.1 mm or less, for example. The dimension of about 0.1 mm is about twice the amplitude of the vibration in the vertical direction (Z-axis direction).

An experimental example in which electronic components 3 were fed using feeder 1 will be described with reference to FIG. 4. In this experimental example, electronic components 3 each having a planar dimension of about 3.2 mm×about 2.5 mm were used. Accommodation plate 2 with 2646 accommodation holes 4 in 49 rows and 54 columns was used. A horizontal vibration and a vertical vibration having the number of vibrations of about 80 Hz and having an amplitude in the range of about 0.05 mm to about 0.5 mm were applied to accommodation plate 2.

First, as shown in part (1) of FIG. 4, about 4000 electronic components 3, that is about 1.5 times as many as accommodation holes 4, were loaded onto main surface 6 of accommodation plate 2 while being bunched up to the left portion of main surface 6.

Figure 7:
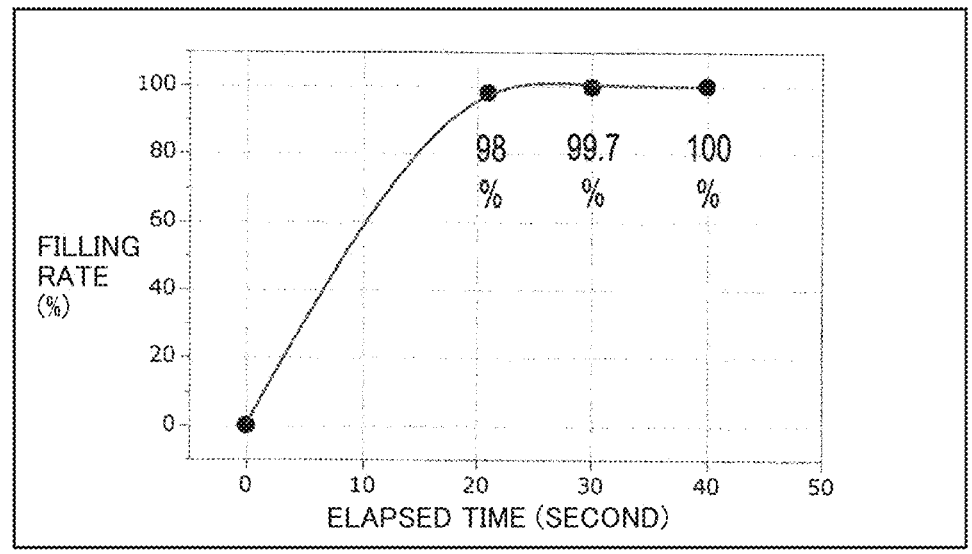
FIG. 7 shows a relationship between a filling rate of electronic components and an elapsed time, which is determined in an experiment in which the feeding method with feeder 1 shown in FIG. 1 was conducted.

Subsequently, a horizontal vibration and a vertical vibration were applied to accommodation plate 2 to move electronic component group 3A in the direction of arrows 39 in part (1) of FIG. 4. Consequently, after a lapse of about 21 seconds, electronic component group 3A moved in a manner of being bunched up to the right portion of main surface 6 of accommodation plate 2, as shown in part (2) of FIG. 4. At this time, 52 accommodation holes 4 remained yet to be filled. That is to say, a filling rate of about 98.0% was obtained as shown in FIG. 7.

Subsequently, electronic component group 3A was moved in the direction of arrows 40 in part (2) of FIG. 4. Consequently, after a lapse of about 30 seconds, electronic component group 3A moved in a manner of being bunched up to the left portion of main surface 6 of accommodation plate 2 as shown in part (3) of FIG. 4. At this time, eight accommodation holes 4 remained yet to be filled. That is to say, a filling rate of about 99.7% was obtained as shown in FIG. 7.

Subsequently, electronic component group 3A was moved in the direction of arrows 41 in part (3) FIG. 4. Consequently, after a lapse of about 40 seconds, electronic component group 3A moved in a manner of being bunched up to the right portion of main surface 6 of accommodation plate 2 as shown in part (4) of FIG. 4. At this stage, there were no accommodation holes 4 yet to be filled, and a filling rate of 100% was obtained as shown in FIG. 7.

The experimental example described above confirmed that when electronic components 3 about 1.5 as many as accommodation holes 4 are fed, that is, a loading ratio is about 1.5 times, a filling rate of 100% is obtained after a lapse of about 40 seconds. Thus, an experiment was attempted to investigate what extent of filling rate is obtained when a loading ratio is changed while fixing a feeding time of electronic components 3 at about 40 seconds.

For this experimental example, a feeding method with feeder 1, in which the data of FIG. 7 was obtained, was performed in the example within the scope of a preferred embodiment of the present invention. Contrastingly, for a comparative example outside the scope of a preferred embodiment of the present invention, a feeding method employing oscillations of an accommodation plate as described in Japanese Patent Laying-Open No. 2004-359512 was performed. In the comparative example, an oscillating angle of the accommodation plate was about 10 degrees to about 20 degrees, the accommodation plate oscillated to and fro three times every 40 seconds, and a vibration of about 20 Hz was applied in the direction of the axis of oscillation.

Figure 8:
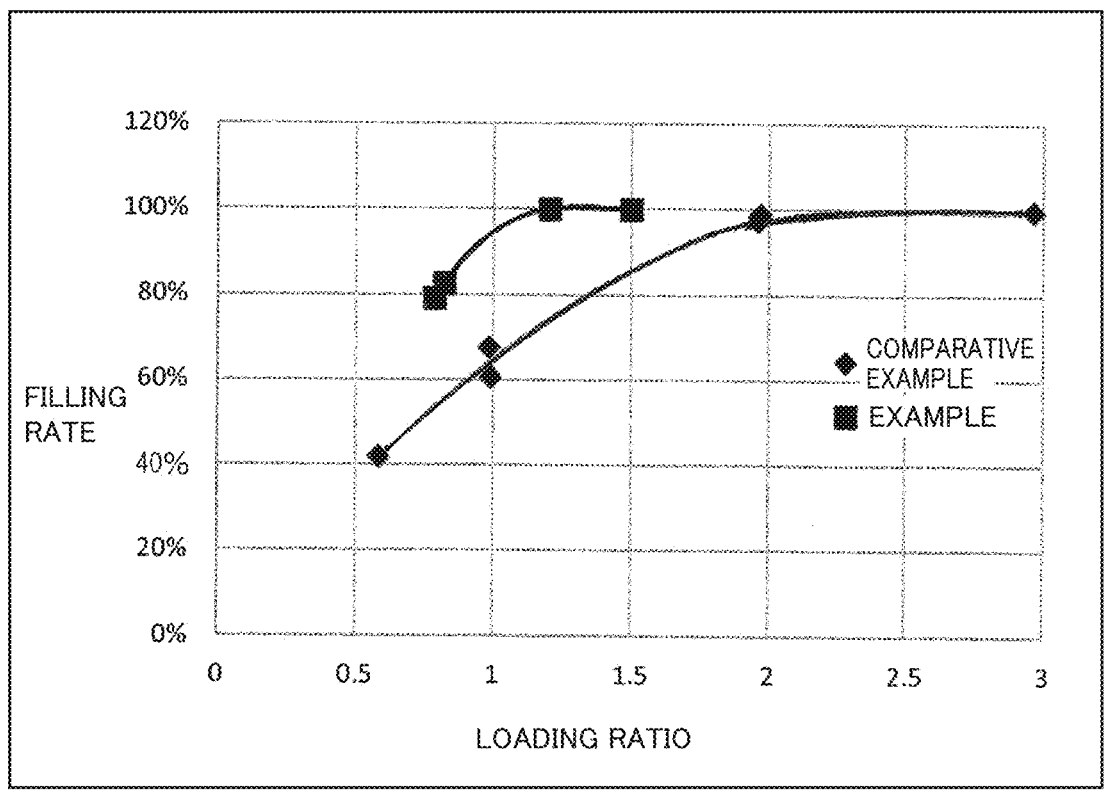
FIG. 8 shows a relationship between a rate of filling with electronic components and a ratio of loading electronic components, which is determined by experiment for an example in which the feeding method with feeder 1 shown in FIG. 1 was conducted and for a comparative example in which a feeding method using oscillation of an accommodation plate, as described in Japanese Patent Laying-Open No. 2004-359512, was conducted.

FIG. 8 shows a relationship between a rate of filling with electronic components and a ratio of loading electronic components, which was obtained by experiment for the example and the comparative example. FIG. 8 reveals that when a feeding operation was performed for about 40 seconds, a filling rate of 100% was obtained by setting the loading ratio to about 1.2 times or more in the example, while in the comparative example, a filling rate of 100% was not obtained even by doubling the loading ratio, and a filling rate of 100% was obtained finally by tripling the loading ratio.

Thus, the example can maintain a low loading ratio, which is required to obtain a filling rate of 100%.

In the example, the occurrence of a fracture or a chip of an electronic component fed into an accommodation hole was investigated. Consequently, in the comparative example, a fracture or a chip appeared as relatively large damage, and an extent of the damage caused by a fracture or a chip was higher and damage occurred more frequently as the loading ratio increased. Contrastingly, in the example, the occurrence of a fracture or a chip increased very little even when the loading ratio became higher, and even when a fracture or a chip occurred, a degree of damage was lower, and the occurrence of a fracture or a chip was lower than in the comparative example.

Although only X-axis direction vibrating mechanism 11X was driven in order to provide a horizontal vibration to accommodation plate 2 in the above-described preferred embodiment, only Y-axis direction vibrating mechanism 11Y may be driven, or both of X-axis direction vibrating mechanism 11X and Y-axis direction vibrating mechanism 11Y may be driven.

Figure 9:
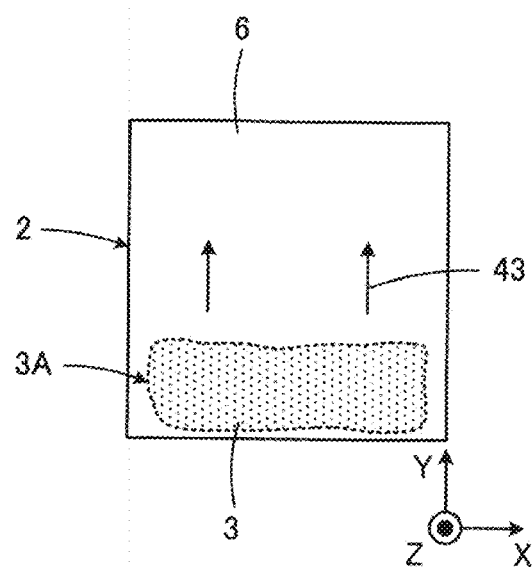
FIG. 9 is a view for illustrating another example operation of feeder 1 shown in FIG. 1.

FIG. 9 shows a case in which only Y-axis direction vibrating mechanism 11Y is driven in order to provide a horizontal vibration to accommodation plate 2. In this case, electronic component group 3A moves in the direction of arrows 43 which is the Y-axis direction. A phase difference between the horizontal vibration by Y-axis direction vibrating mechanism 11Y and the vertical vibration by Z-axis direction vibrating mechanism 11Z is reversed to be plus or minus, so that electronic component group 3A moves in the Y-axis direction opposite to the direction of arrows 43.

Figure 10:
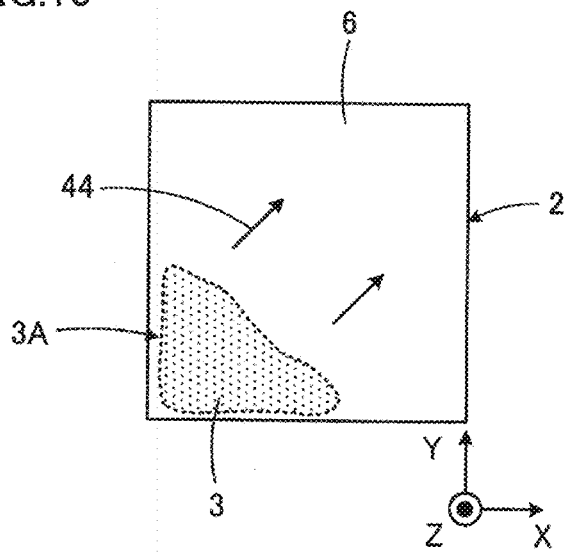
FIG. 10 is a view for illustrating still another example operation of feeder 1 shown in FIG. 1.

FIG. 10 shows a case in which both of X-axis direction vibrating mechanism 11X and Y-axis direction vibrating mechanism 11Y are driven in order to provide a horizontal vibration to accommodation plate 2. In this case, electronic component group 3A moves in the direction of arrows 44 oblique to both of the X-axis and the Y-axis. At this time, the direction of arrows 44 is able to be changed by adjusting at least one of the amplitude of the horizontal vibration by X-axis direction vibrating mechanism 11X and the amplitude of the horizontal vibration by Y-axis direction vibrating mechanism 11Y.

It is seen by referring to FIGS. 4, 9, and 10 described above that electronic component group 3A on accommodation plate 2 is able to be moved in any appropriate horizontal direction. This can be used to develop a preferred embodiment of the present invention as described below.

That is to say, each of electronic components 3 is fed into a corresponding one of accommodation holes 4 by applying vibrations to accommodation plate 2, and then, the step of finding accommodation holes 4 yet to be filled, into which no electronic components 3 have been fed, is performed. In order to perform this step, for example, a camera is installed in feeder 1 to detect accommodation holes 4 yet to be filled, using the camera. Subsequently, the following step is further performed: electronic components 3 which have not been fed into accommodation holes 4 and remain on main surface 6 of accommodation plate 2 are moved toward accommodation holes 4 yet to be filled. The present preferred embodiment is able to increase the rate of filling accommodation holes 4 with electronic components 3 in a short period of time.

Figure 11:
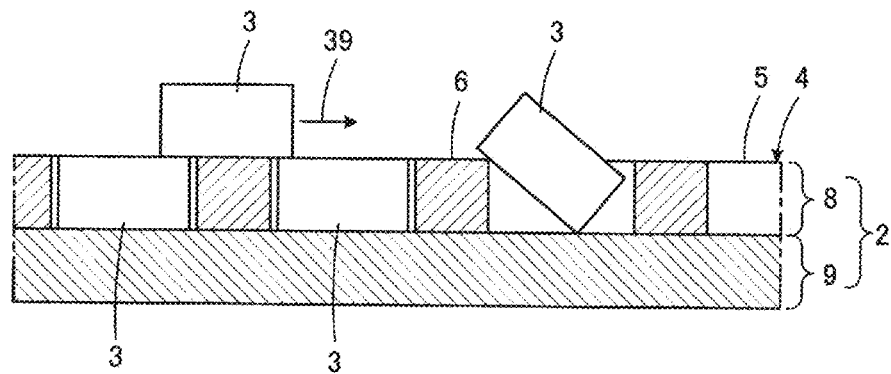
FIG. 11 is a sectional view of a portion of a feeder which performs a method of feeding electronic components according to a Preferred Embodiment 2 of the present invention, which corresponds to FIG. 5.
Figure 12:
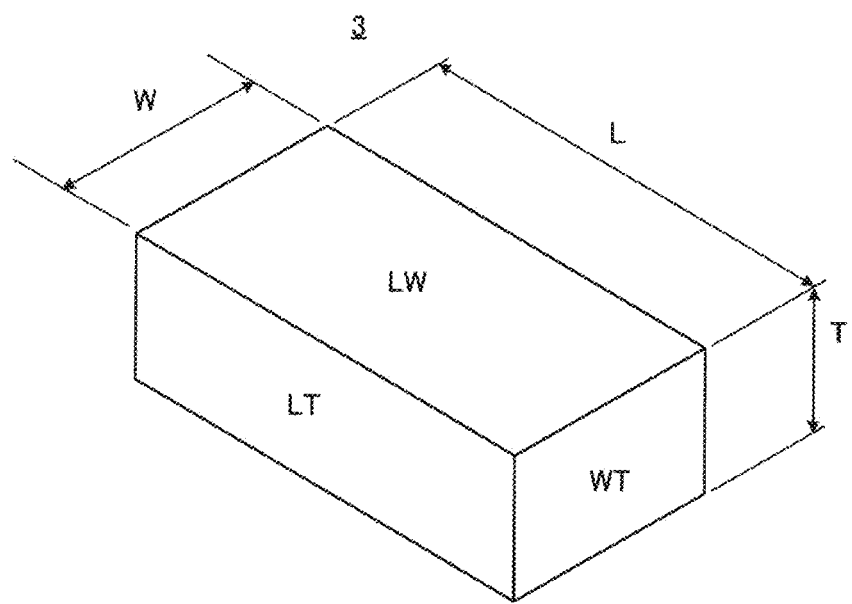
FIG. 12 is a perspective view schematically showing an electronic component 3 for illustrating the preferred embodiment of the present invention shown in FIG. 11.
Figure 13:
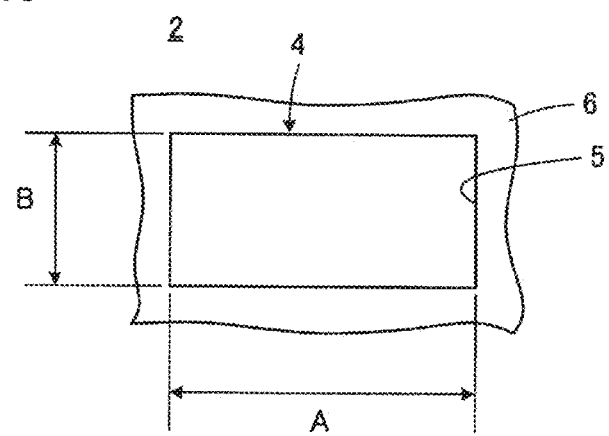
FIG. 13 is a plan view of an opening 5 of an accommodation hole 4 for illustrating the preferred embodiment of the present invention shown in FIG. 11.

A Preferred Embodiment 2 of the present invention will now be described with reference to FIGS. 11 to 13. FIG. 11 is a sectional view corresponding to FIG. 5. FIG. 12 is a perspective view schematically showing appearance of electronic component 3. FIG. 13 is a plan view of opening 5 of accommodation hole 4.

The Preferred Embodiment 2 differs from the Preferred Embodiment 1 in the orientation of electronic component 3 which is accommodated in accommodation hole 4. Although electronic component 3 has a rectangular or substantially rectangular parallelepiped shape as described above, in more detail with reference to FIG. 12, electronic component 3 has a rectangular or substantially rectangular parallelepiped shape defined by a length dimension L, a width dimension W, and a thickness dimension T measured in the length direction, the width direction, and the thickness direction orthogonal or substantially orthogonal to each other, respectively, and length dimension L is largest among length direction L, width direction W, and thickness direction T. Also, width dimension W is larger than thickness dimension T.

As shown in FIG. 11, the depth dimension of accommodation hole 4 is preferably equal or substantially equal to thickness dimension T of electronic component 3 shown in FIG. 12. Also, dimensions A and B of opening 5 of accommodation hole 4 shown in FIG. 13 are selected so as to accept length dimension L and width dimension W of electronic component 3, respectively. Opening 5 of accommodation hole 4 is thus able to accept an LW surface defined by length dimension L and width dimension W of electronic component 3, and accordingly, electronic component 3 is fed into accommodation hole 4 with an LW surface, defined by length dimension L and width dimension W thereof, extending along opening 5 of accommodation hole 4.

As described above, the fact that opening 5 of accommodation hole 4 is able to accept the LW surface of electronic component 3 means that opening 5 is able to accept a WT surface defined by width dimension W and thickness dimension T and an LT surface defined by length dimension L and thickness dimension T, which are smaller than the LW surface. In the present preferred embodiment, thus, the following irregular state may occur for feeding of electronic components 3 into accommodation holes 4: a plurality of electronic components 3 may be fed into one accommodation hole 4 as shown in FIG. 14, or electronic component 3 may be fed into accommodation hole 4 in an orientation other than the regular orientation.

Figure 14:
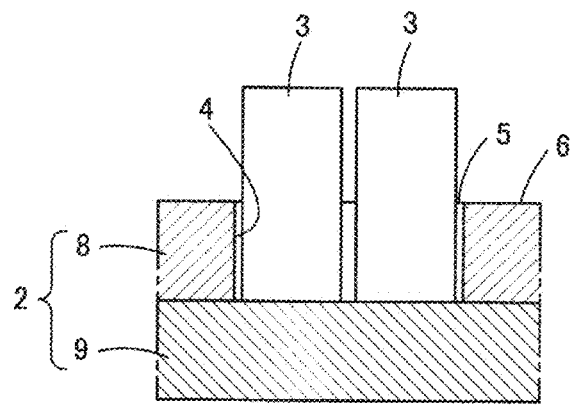
FIG. 14 is a sectional view showing a first irregular state occurring in the preferred embodiment of the present invention shown in FIG. 11.
Figure 15:
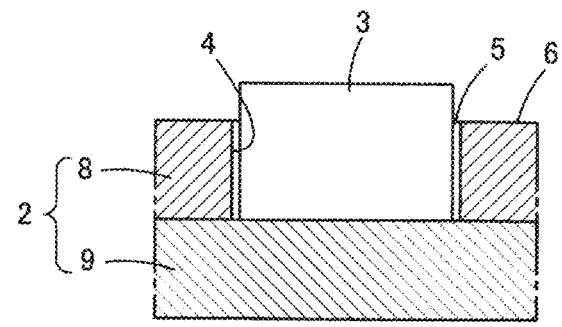
FIG. 15 is a sectional view showing a second irregular state occurring in the preferred embodiment of the present invention shown in FIG. 11.

In FIG. 14, two electronic components 3 are fed into one accommodation hole 4 with WT surfaces thereof facing upward and LW surfaces thereof facing each other. In FIG. 15, though one electronic component 3 is fed into accommodation hole 4, the LT surface faces upward.

When such an irregular state occurs, the amplitude of at least the vertical vibration is increased further in the step of applying vibrations to accommodation plate 2. In this case, for example, the amplitude of the vertical vibration is selected such that electronic component 3 in the regular state does not fall out of accommodation hole 4 and electronic component 3 in the irregular state does fall out of accommodation hole 4. The center of gravity of each of electronic components 3 in the irregular state shown in FIGS. 14 and 15 is located at a position higher than the center of gravity of electronic component 3 in accommodation hole 4 which is in the regular state shown in FIG. 11. Thus, only electronic component 3 in the irregular state is allowed to fall out of accommodation hole 4 by further increasing the amplitude of the vertical vibration while applying a horizontal vibration, and thereafter, electronic component 3 is able to be fed into accommodation hole 4 in the regular state as shown in FIG. 11.

When electronic component 3 to be handled has width dimension W and thickness dimension T equal or substantially equal to each other, the state shown in FIG. 15 is not the irregular state. The Preferred Embodiment 2 is accordingly suitable for handling electronic component 3 having width dimension W and thickness dimension T equal or substantially equal to each other.

A Preferred Embodiment 3 of the present invention will now be described with reference to FIG. 16. Although one electronic component 3 is fed into one accommodation hole 4 in the step of feeding each of electronic components 3 into a corresponding one of accommodation holes 4 in the preferred embodiment described above, a plurality of electronic components 3 are fed into one accommodation hole 4 in the present preferred embodiment, as shown in FIG. 16.

Figure 16:
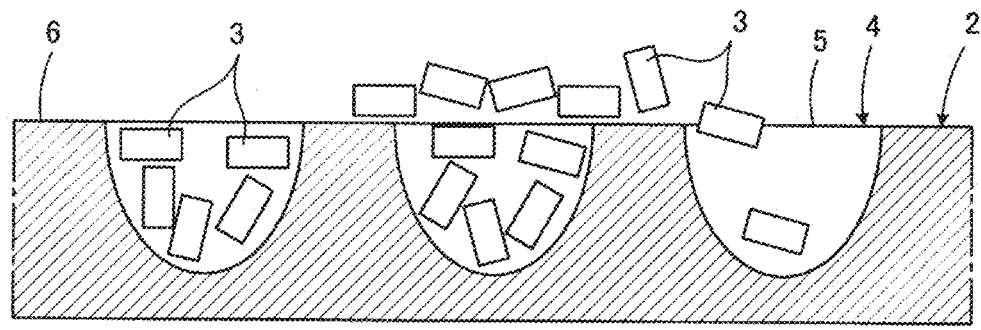
FIG. 16 is a sectional view of a portion of a feeder which performs a method of feeding electronic components according to a Preferred Embodiment 3 of the present invention, which corresponds to FIG. 5.

The present preferred embodiment shown in FIG. 16 is advantageously applied to a case in which a large number of electronic components 3 are divided into a plurality of groups. For example, a large number of green ceramic element bodies as electronic components 3 are fired simultaneously in the firing step performed to produce ceramic electronic components, where the large number of ceramic element bodies is preferably arranged at the most uniform possible density in order to prevent uneven firing. At this time, through application of the present preferred embodiment shown in FIG. 16, a large number of ceramic element bodies is able to be disposed at a substantially uniform density by arranging an appropriate number of ceramic element bodies as electronic components 3, each of which has been fed into a corresponding one of accommodation holes 3, in a firing furnace while maintaining a positional relationship without any change.

Figure 17:
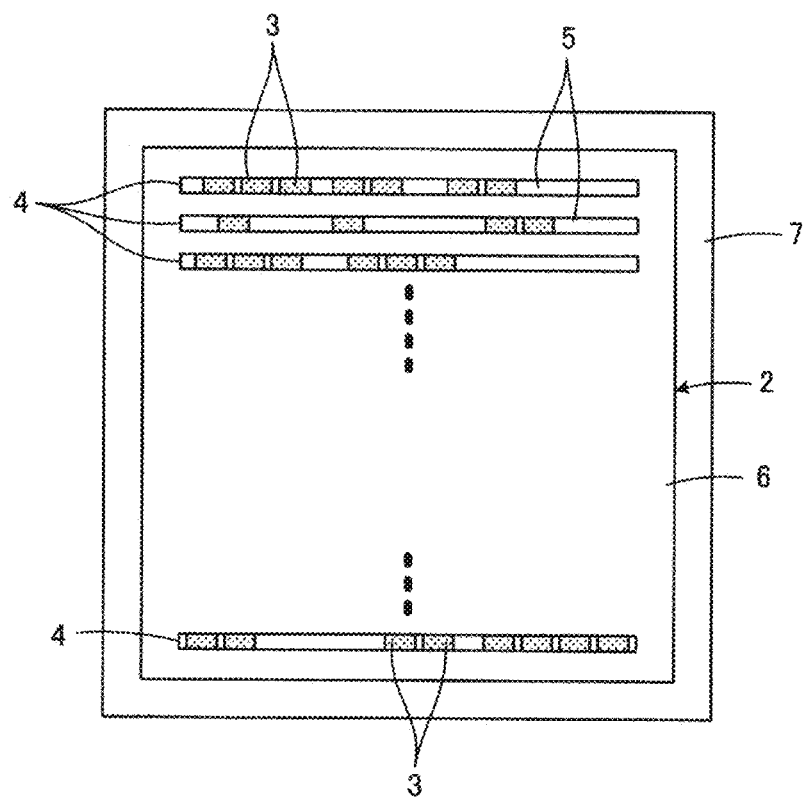
FIG. 17 is a plan view schematically showing an accommodation plate 2 of a feeder which performs a method of feeding electronic components according to a Preferred Embodiment 4 of the present invention.

A Preferred Embodiment 4 of the present invention will now be described with reference to FIG. 17. It is intended in the Preferred Embodiment 4 that a plurality of electronic components are fed into one accommodation hole 4 as in the Preferred Embodiment 3 described above.

In the Preferred Embodiment 4, accommodation hole 4 includes a longitudinal opening 5 into which a plurality of electronic components 3 are able to be fed in a column. In the present preferred embodiment, electronic components 3 which have been fed into accommodation hole 4 are aligned, thus efficiently performing, for example, the step of supplying electronic components 3 which may be performed after the feeding step.

Figure 18:
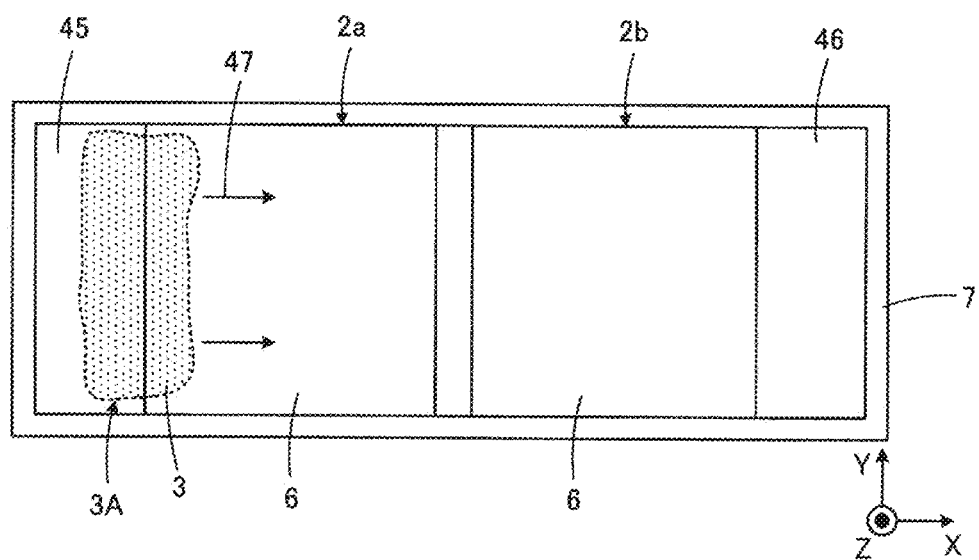
FIG. 18 is a plan view schematically showing accommodation plates 2a and 2b of a feeder which performs a method of feeding electronic components according to a Preferred Embodiment 5 of the present invention.
Figure 19:
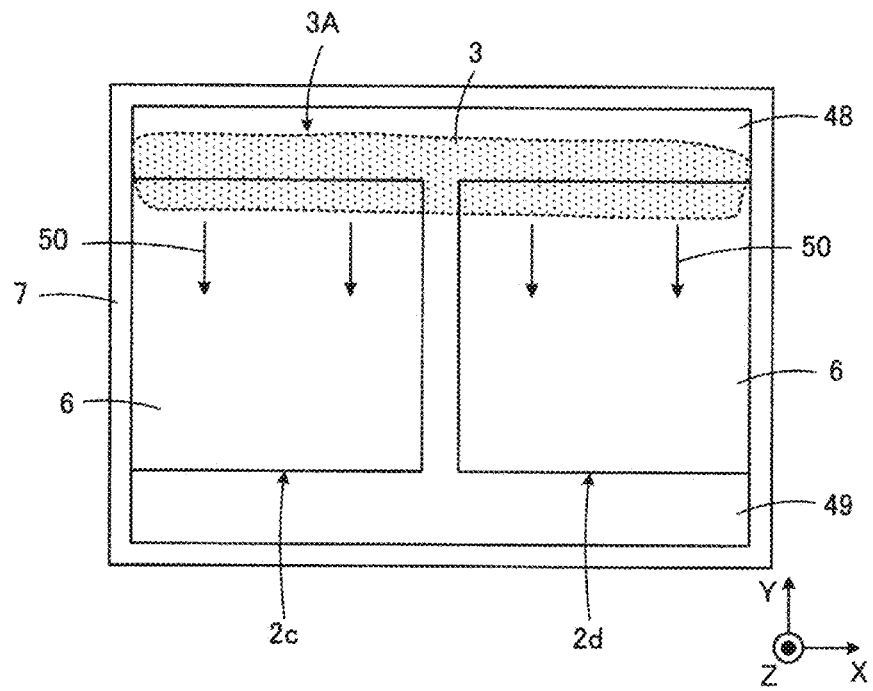
FIG. 19 is a plan view schematically showing accommodation plates 2c and 2d of a feeder which performs a method of feeding electronic components according to a Preferred Embodiment 6 of the present invention.

A Preferred Embodiment 5 of the present invention will now be described with reference to FIG. 18. The Preferred Embodiment 5 is characterized by the use of a plurality of, for example, two accommodation plates 2a and 2b. The two accommodation plates 2a and 2b are disposed such that their main surfaces 6 are flush with each other. In this state, a common vibration imparting mechanism (not shown) applies horizontal vibrations and vertical vibrations simultaneously to the two accommodation plates 2a and 2b. FIGS. 18 and 19, which will be described below, show no accommodation holes 4 as in parts (1) to (4) of FIG. 4.

As shown in FIG. 18, first and second standby areas 45 and 46 are provided at opposite ends of the two accommodation plates 2a and 2b in the direction in which accommodation plates 2a and 2b are arranged, and the two accommodation plates 2a and 2b and first and second standby areas 45 and 46 are surrounded by a common frame member 7.

In FIG. 18, an aggregate of a plurality of electronic components 3 is shown as an electronic component group 3A. First, electronic components 3 are loaded in, for example, first standby area 45. Subsequently, horizontal vibrations in the X-axis direction and vertical vibrations in the Z-axis direction are applied to accommodation plates 2a and 2b. Consequently, electronic components 3 move in the direction of arrows 47 along main surface 6 of accommodation plate 2a and then along main surface 6 of accommodation plate 2b while forming electronic component group 3A as a single mass.

As a result of the movement of electronic component group 3A in the direction of arrows 47, electronic component group 3A reaches second standby area 46. In the course of this movement, electronic components 3 are fed into accommodation holes 4 of accommodation plate 2a and then into accommodation holes 4 of accommodation plate 2b. Thus, electronic components 3 that reach second standby area 46 are fewer than electronic components 3 originally loaded. At this stage, normally, all of accommodation holes 4 are not filled with electronic components 3, and some accommodation holes 4 are left empty.

Subsequently, the phase difference between the horizontal vibrations and the vertical vibrations provided to accommodation plates 2a and 2b is reversed to be plus or minus, causing electronic component group 3A to move from second standby area 46 toward first standby area 45. During this movement, electronic components 3 are fed into accommodation holes 4 yet to be filled.

Thereafter, the movement of electronic component group 3A is repeated as many times as required.

It is preferable in the present preferred embodiment that accommodation plates 2a and 2b be removable individually from the feeder. With such a preferable configuration, accommodation plates 2a and 2b are able to be sequentially sent to a following step starting from any accommodation plate in which accommodation holes 4 have been filled with electronic components 3, enabling efficient process steps. Also, any one of accommodation plate 2a or 2b is removed, and then, an empty accommodation plate that replaces the removed accommodation plate is provided.

A Preferred Embodiment 6 will now be described with reference to FIG. 19. In the Preferred Embodiment 6, a plurality of, for example, two accommodation plates 2c and 2d are provided as in the Preferred Embodiment 5. A difference of the Preferred Embodiment 6 from the Preferred Embodiment 5 will be described below.

As shown in FIG. 19, first and second standby areas 48 and 49 are provided at opposite ends of two accommodation plates 2c and 2d in the direction orthogonal or substantially orthogonal to the direction in which accommodation plates 2c and 2d are arranged, and the two accommodation plates 2c and 2d and first and second standby areas 48 and 49 are surrounded by a common frame member 7.

In FIG. 19, an aggregate of electronic components 3 is shown as electronic component group 3A. First, electronic components 3 are loaded in, for example, first standby area 48. Subsequently, horizontal vibrations in the Y-axis direction and vertical vibrations in the Z-axis direction are applied to accommodation plates 2c and 2d. Consequently, electronic components 3 move in the direction of arrows 50 over main surface of each of accommodation plates 2c and 2d while showing electronic component group 3A as a single mass.

As a result of the movement of electronic component group 3A in the direction of arrows 50 described above, electronic component group 3A reaches second standby area 49. In the course of this movement, electronic components 3 are fed into accommodation holes 4 of accommodation plates 2c and 2d. Thus, electronic components 3 that reach second standby area 49 are fewer than electronic components 3 originally loaded. At this stage, normally, all of accommodation holes 4 are not filled with electronic components 3, and some accommodation holes 4 are left empty.

Subsequently, the phase difference between the horizontal vibrations and the vertical vibrations provided to accommodation plates 2c and 2d is reversed to be plus or minus, causing electronic component group 3A to move from second standby area 49 toward first standby area 48. During this movement, electronic components 3 are fed into accommodation holes 4 yet to be filled.

Thereafter, the movement of electronic component group 3A is repeated as many times as required.

It is preferable also in the present preferred embodiment that accommodation plates 2a and 2b be removable individually from the feeder to enable efficient process steps.

Other configurations as well as other advantageous operations and effects of the Preferred Embodiment 6 are the same or substantially the same as those of the Preferred Embodiment 5.

Figure 20:
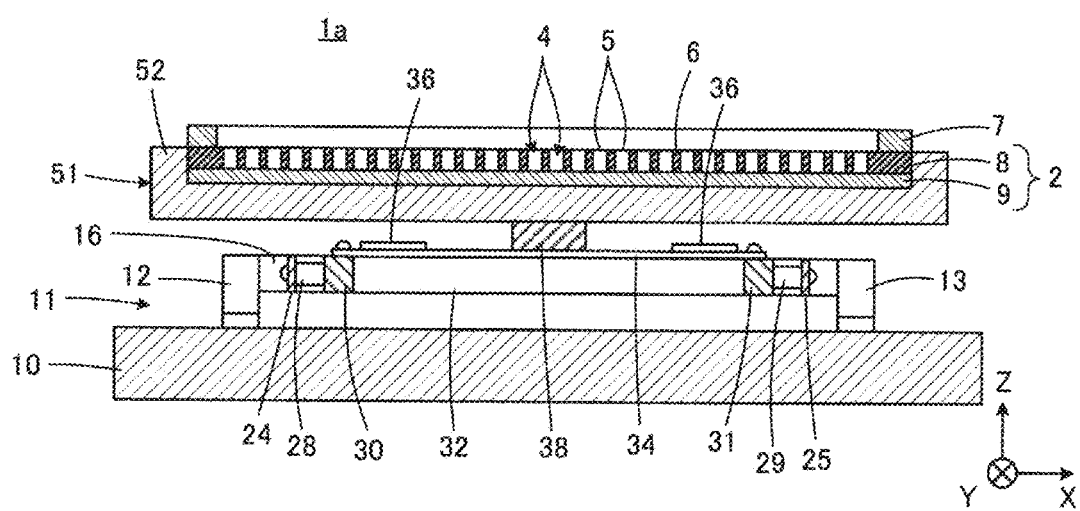
FIG. 20 is a sectional view of a feeder 1a which performs a method of feeding electronic components according to a Preferred Embodiment 7 of the present invention, which corresponds to FIG. 3.

A Preferred Embodiment 7 of the present invention will now be described with reference to FIG. 20. FIG. 20 corresponds to FIG. 3 showing the Preferred Embodiment 1. In comparison with the Preferred Embodiment 1, in the Preferred Embodiment 7, accommodation plate 2 is easily removable from a feeder 1a. The configurations in which the accommodation plate is removable from the feeder in the Preferred Embodiment 5 and the Preferred Embodiment 6 described above are easily achieved by providing, for example, the configuration of the Preferred Embodiment 7.

A support 51 is attached to pedestal 38 in feeder 1a. Support 51 includes a rising portion 52 in its periphery, and accommodation plate 2 is disposed on support 51 while being fitted into rising portion 52 to be positioned. Accommodation plate 2 includes upper plate 8 and lower plate 9 as in the Preferred Embodiment 1.

The configuration in which an accommodation plate is removable may be achieved by a mechanical fitting structure of any other suitable configuration or by holding device using vacuum contact or magnetic force.

The preferred embodiments of the present invention described above are illustrative, and any modifications may be made within the scope of the present invention. For example, an electronic component to be handled may have a shape other than a rectangular or substantially rectangular parallelepiped shape and may be an electronic component having a disc shape, cylindrical shape, or prism shape, or a coil-shaped electronic component including a helically wound wire.

Preferred embodiments of the present invention are also applicable to an operation of simultaneously performing a feeding step on electronic components of a plurality of types with the use of one or a plurality of accommodation plates including accommodation holes of a plurality shapes and sizes, thus sorting out electronic components for each type of an accommodation hole.

The scope of the present invention is not limited to the preferred embodiments described above and includes preferred embodiments in which the configuration is partially replaced or the configurations are combined.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A method of feeding electronic components, the method comprising:
    preparing an accommodation plate including a plurality of accommodation holes, respective openings of the plurality of accommodation holes being distributed over a main surface of the accommodation plate;
    loading a plurality of electronic components onto the main surface of the accommodation plate; and
    applying a horizontal vibration in at least one of an X-axis direction and a Y-axis direction and a vertical vibration in a Z-axis direction to the accommodation plate while maintaining the main surface level, where the X-axis direction and the Y-axis direction are orthogonal or substantially orthogonal to each other on a horizontal plane and the Z-axis direction is orthogonal or substantially orthogonal to both of the X-axis direction and the Y-axis direction; wherein
    the applying of the vibrations to the accommodation plate includes:
        moving the plurality of electronic components over the main surface of the accommodation plate; and
        feeding each of the plurality of electronic components into a corresponding one of the plurality of accommodation holes while moving the plurality of electronic components over the main surface of the accommodation plate;
    the horizontal vibration and the vertical vibration have an equal or substantially equal number of vibrations and have a prescribed phase difference therebetween; and
    in the feeding of each of the plurality of electronic components into a corresponding one of the plurality of accommodation holes, at least two of the electronic components are to be fed into one of the accommodation holes.

2. The method according to claim 1, wherein the number of vibrations of the horizontal vibration and the vertical vibration is about 50 Hz or more.

3. The method according to claim 1, wherein the applying of the vibrations to the accommodation plate includes adjusting the phase difference between the horizontal vibration and the vertical vibration.

4. The method according to claim 3, wherein the adjusting of the phase difference includes reversing the phase difference to be plus or minus.

5. The method according to claim 1, wherein each of the electronic components has a rectangular or substantially rectangular parallelepiped shape defined by a length dimension, a width dimension, and a thickness dimension measured in a length direction, a width direction, and a thickness direction orthogonal or substantially orthogonal to each other, respectively, and the length dimension is largest among the length dimension, the width dimension, and the thickness dimension.

6. The method according to claim 5, wherein
    a depth dimension of each of the accommodation holes is equal or substantially equal to the length dimension, and an opening of each of the accommodation holes is selected so as not to accommodate the length dimension and so as to accommodate the width dimension and the thickness dimension.

7. The method according to claim 1, wherein
    in the feeding of each of the plurality of electronic components into a corresponding one of the plurality of accommodation holes, an irregular state in which some of the electronic components are fed into one of the accommodation holes or the electronic components are fed into the accommodation holes in an orientation other than a regular orientation is caused; and
    the applying of the vibrations to the accommodation plate includes further increasing an amplitude of at least the vertical vibration to resolve the irregular state.

8. The method according to claim 1, wherein the applying of the vibrations to the accommodation plate further includes, after the feeding of each of the plurality of electronic components into a corresponding one of the plurality of accommodation holes:
    finding the accommodation holes yet to be filled, into which the electronic components have not been fed; and
    moving the electronic components which have not been fed into the accommodation holes and remain on the main surface of the accommodation plate toward the accommodation holes yet to be filled.

9. The method according to claim 1, wherein in the loading of the plurality of electronic components onto the main surface of the accommodation plate, a larger number of the electronic components than the accommodation holes are loaded.

10. The method according to claim 1, wherein the one accommodation hole has a longitudinal opening which allows some of the electronic components to be fed thereinto in a column.

11. The method according to claim 1, further comprising removing the accommodation plate with some of the accommodation holes filled with the electronic components.

12. The method according to claim 11, wherein
    the preparing of the accommodation plate includes preparing a plurality of the accommodation plates;
    the feeding of each of the plurality of electronic components into a corresponding one of the plurality of accommodation holes is performed with a plurality of the main surfaces of the plurality of accommodation plates being flush with each other; and the removing of the accommodation plate includes removing the plurality of accommodation plates at different points in time.

13. An electronic component feeder that performs a method of feeding electronic components according to claim 1.

14. The electronic component feeder according to claim 13, wherein the number of vibrations of the horizontal vibration and the vertical vibration is about 50 Hz or more.

* * * * *